(12) United States Patent
Chee et al.

(10) Patent No.: US 7,703,514 B2
(45) Date of Patent: *Apr. 27, 2010

(54) OPTICAL FIBER SYSTEM AND METHOD FOR WELLHOLE SENSING OF FLUID FLOW USING DIFFRACTION EFFECT OF FARADAY CRYSTAL

(75) Inventors: Soon Seong Chee, Tokyo (JP); Colin Wilson, Kanagawa-ken (JP)

(73) Assignee: Schlumberger Technology Corporation, Sugar Land, TX (US)

( * ) Notice: Subject to any disclaimer, the term of this patent is extended or adjusted under 35 U.S.C. 154(b) by 60 days.

This patent is subject to a terminal disclaimer.

(21) Appl. No.: 12/049,360

(22) Filed: Mar. 16, 2008

(65) Prior Publication Data

US 2009/0167297 A1    Jul. 2, 2009

Related U.S. Application Data

(63) Continuation-in-part of application No. 11/964,055, filed on Dec. 26, 2007, now Pat. No. 7,413,011.

(51) Int. Cl.
*E21B 47/00* (2006.01)

(52) U.S. Cl. .......... 166/250.01; 166/66.5; 324/220; 324/221

(58) Field of Classification Search .......... None
See application file for complete search history.

(56) References Cited

U.S. PATENT DOCUMENTS 4,584,470 A    4/1986    Iizuka et al.

7,413,011 B1 *  8/2008  Chee et al. ............. 166/250.01

FOREIGN PATENT DOCUMENTS

| CN | 200985785 | 12/2007 |
| EP | 0 741 298 | 11/1996 |
| EP | 1669769 A1 | 6/2006 |
| GB | 2242743 | 10/1991 |
| GB | 2409871 A | 7/2005 |

OTHER PUBLICATIONS

G.B. Scott and D.E. Lacklison, "Magnetooptic Properties and Applications of Bismuth Substituted Iron Garnets," IEEE Transactions on Magnetics, vol. Mag. 12, No. 4, Jul. 1976.

T.R. Johansen et al, "Variation of Stripe Domain Spacing in a Faraday Effect Light Deflector," Journal of Applied Physics, vol. 42, No. 4, Mar. 15, 1971.

V. J. Fratello, "Sensitivity of Faraday Rotator for Sensor Applications", Integrated Photonics Inc., Feb. 2004.

V. J. Fratello, "Preliminary Applications Note—Thick Film Faraday Rotator for Polarization Control Applications", Integrated Photonics Inc., Oct. 1, 2003.

(Continued)

*Primary Examiner*—Zakiya W. Bates
(74) *Attorney, Agent, or Firm*—Matthias Abrell; Jody DeStefanis; Jeff Griffin (57) ABSTRACT

A system and method for optically determining the rate and/or direction of fluid flow in a conduit within wellholes, using the diffraction effect of Faraday crystals through which continuous light is transmitted within optical fibers.

12 Claims, 9 Drawing Sheets

OTHER PUBLICATIONS

G. D. VanWiggeren and R. Roy, "Transmission of Linearly Polarized Light through a single mode fiber with random fluctuations of bireferegence", Appl. Optics, vol. 38 No. 18, 1999.

U Holm, H Sohlström and T Brogårdh, "Measurement system for magneto-optic sensor materials", J. Phys. E: Sci. Instrum., vol. 17, p. 885-889, 1984.

L. Veeser, P. Rodriguez, P. Forman, M. Deeter, "Optical Wheel-Rotation Sensor", Optical Fiber Sensor Conference, 1994.

H. Sohlström, "Fibre Optic Magnetic Field Sensors Utilizing Iron Garnet Materials", Thesis Paper, Instrumentation Laboratory, Sweden, 1993.

M.N. Deeter, A. H. Rose and G. W. Day, "Fast, Sensitive Magnetic-Field Sensors Based on the Faraday Effect in YIG", J. Lightwave Tech., vol. 8, No. 12, pp. 1838-1842, 1990.

H. Takeuchi, S. Ito, I. Mikami and S. Taniguchi, "Faraday Rotation and Optical Absorption of a Single Crystal of Bismuth-substituted Gadolinium Iron Garnet", J. Appl. Phys., vol. 44, p. 4789, 1973.

* cited by examiner

(COUNTER-CLOCKWISE ROTATION)

(CLOCKWISE ROTATION)

OPTICAL FIBER SYSTEM AND METHOD FOR WELLHOLE SENSING OF FLUID FLOW USING DIFFRACTION EFFECT OF FARADAY CRYSTAL

CROSS-REFERENCE TO RELATED APPLICATION

This application relates to U.S. patent application Ser. No. 11/964,055, entitled, "Optical Fiber System And Method For Wellhole Sensing Of Magnetic Permeability Using Diffraction Effect Of Faraday Rotator," filed on Dec. 26, 2007. This application is a continuation-in-part of the above referenced application with common inventorship and assignment with the subject application. The disclosure of this prior parent application is hereby incorporated by reference as though set forth at length and the priority date of Dec. 26, 2007 for all common subject matter is claimed.

TECHNICAL FIELD

The disclosure herein relates to a method and apparatus for measuring the rate and direction of flow of a liquid through a conduit. It particularly relates to a method and apparatus for measuring the rate of flow of hydrocarbons in, for example, production and fluid injection wells. Most particularly, it relates to a method and apparatus for measuring the rate and direction of fluid flow in oil wells and pipelines utilizing a fully fiber optics based sensor to detect the direction of rotation and rotational velocity of a propeller placed coaxially within the flow stream of the measured fluids. The sensor relies upon the diffraction effect of unpolarized light traversing a magnetooptically sensitive Faraday crystal.

BACKGROUND

When extracting a flow of production fluids such as oil, from a well, or injecting water into a well in secondary recovery methods of oil production, it is important to be able to measure the rate of fluid flow. In the case of oil production, it is also commonly desirable to determine the contribution to the overall flow recovered at the well head from different producing strata within the well. In multiple producing strata, it is desirable to know how much each stratum contributes to the total production of the well. Such information is useful, for example, as a matter of reservoir engineering to make determinations on the extent of reserves or, in the case where flow from a specific stratum is low, to consider taking remedial action such as fracturing in an effort to increase production from such a stratum.

Well bores are lined with casing whose approximate cross sectional area is known. The free internal cross sectional area of production tubing is also known. Accordingly it is possible to derive a measure of the volume of flow at a specific location by measuring the linear velocity of fluids flowing in the casing or piping.

The oil industry has utilized a variety of means of determining velocity of fluid flow. These include magnetic flow meters which depend upon the Faraday electromagnetic induction principle and which may be applied to fluids which are electrically conductive or contain charge carriers. Such meters operate by sensing electromotive force generated by induction in the flowing fluids in the presence of an imposed magnetic field.

Gamma ray meters are sometimes used where low flow-rate wells of less than 1,000 barrels of fluids per day are involved. Such meters require the injection of radioactive tracer elements into the flow stream, from which velocity is determined by timing the passage of such elements by gamma ray detectors that are disposed at known distance intervals along the conduit.

Obstructed flow meters constitute yet another class of flow measuring devices. Such meters employ orifices or other restrictions through which a portion of the fluid flow is directed, with the flow rate being functionally related to a pressure drop measured across the restriction. Obstructed flow meters depend on the Bernoulli principle and are generally restricted to compressible fluids.

In the past few years, a new type of flow meters has been developed based on a Coriolis principle. Fluids are passed through hollow tubes which are caused to vibrate in an angular harmonic oscillation. Due to the Coriolis forces, the tubes will deform and produce an additional vibration component, the presence of which is detected by sensors and is related to the rate of liquid flow within the conduit. The interpretation of signal results and the calibration of such meters can be complicated.

Ultrasonic or sonar meters represent a further type of flow meter. Such meters measure the difference of the transit time of sonic pulses propagated with and against the direction of fluid flow, from which difference the flow rate is determinable. The accuracy of such meters is a function of the physical properties of the fluid flow.

Thermal anemometry provides yet another principle upon which flow meters have been developed. Such meters operate by placing electrically heated probes within a flowing stream of fluid. The liquid flowing by and in contact with the probe causes a heat transfer from the probe to the liquid, which is sensed by measuring the current supplied to the probe to maintain a fixed or determinable temperature. The flow rate of the fluid is related to the amperage of the electrical power supplied to the probe.

The present invention employs a different type of flow metering device, a positive displacement meter. Positive displacement flow meters operate by counting known volumes of fluid (gas or liquid) that pass through the meter. Numerous designs exist for isolating and counting the throughput of liquid. One such form are impeller or turbine-type meters. Fluid flowing through a stationary impeller in the form of a multi-blade propeller or helical screw will cause the impeller to rotate. The angular speed of the impeller (or the number of its rotations) is related to the mass flow and/or linear speed of the fluid flowing within the conduit.

As may be imagined, the various types of meters have both advantages and disadvantages, and generally have applicability in differing specific downhole environments and liquid compositions, as the foregoing discussion has pointed out in broad terms. Ease of insertion of meters into the well; temperature and pressure, corrosiveness of the fluids present, and other environmental conditions within a well; reproducibility of results; accuracy; degree of complexity required to convert raw data and analyze data; and other factors all impact the choice of method and suitability of any given method.

Impeller based flow meters are well known in the art. Prior art impeller meters, however, have certain disadvantages. For example, in Basham and Cmelik, U.S. Pat. No. 4,345,480, impeller rotation direction and speed are sensed digitally by means of two light paths and a light interrupter means. Such a system requires light traveling from its source to the each of the sensing elements to traverse the fluid under measurement. In an oil well environment, where the fluids are usually opaque—as in many hydrocarbons—the sensing means may not be able to "see" the signal. Additionally, the '480 patent relies on downhole electrical circuitry that is both subject to potentially harsh temperature and pressures and requires electrical power to operate. Since wells frequently extend to depths of 25,000 feet or more, temperatures of over 150 degrees Celsius and pressures of 20,000 psi or more are typically present. Such ambient conditions impose rigid design requirements on electrical components. Additionally, power to operate the electronics must be provided from above ground with wiring dedicated to such a task.

The disclosure herein provides a new and unique improvement over the previously known designs. Because the sensing means employed in the present invention depends only on a generated magnetic flux field, passage of light through the measured fluid is not involved. Further, elements employed in the sensor do not involve in situ electronic circuitry the operability of which imposes difficult design criteria to withstand temperature and pressure extremes found in a wellbore environment. Nor does the invention require providing electrical power at the sensor. Finally, the systems and methods herein are fully optical fiber based, thereby avoiding any requirement to direct electrical wiring downhole. With the increasing use of optical fiber based systems for composition analysis of downhole fluids, location of casing collars and corrosion in well tubing and other well logging functions, it may be possible to multiplex the signals generated by the present system and methods on an existing optical fiber used for other purposes, thereby obviating a need for a separate signal line.

SUMMARY

Depolarized light is guided through an optical fiber to a sensor employing magnetooptically sensitive material. By means of a changing magnetic field generated by a decoder coupled to an impeller which is rotated by the flow of fluids within a conduit, digital signals are generated in the sensor. Such signals arise as a result of a Faraday diffraction effect. Where the conduit is a well hole, the signals are guided back to the surface of the well through an optical fiber, are detected there, and analyzed after converting the fiber optic signals to electrical signals. The changing magnetic field is generated by magnets attached to the decoder and disposed in characteristic patterns on the decoder. The resulting digital signals relate to the direction of rotation and the rate of flow of fluids within the conduit.

THE DRAWINGS

Other aspects of the disclosure herein will become apparent from the following detailed description of embodiments taken in conjunction with the accompanying drawings wherein.

DETAILED DESCRIPTION

Context of the Disclosure

Figure 1:
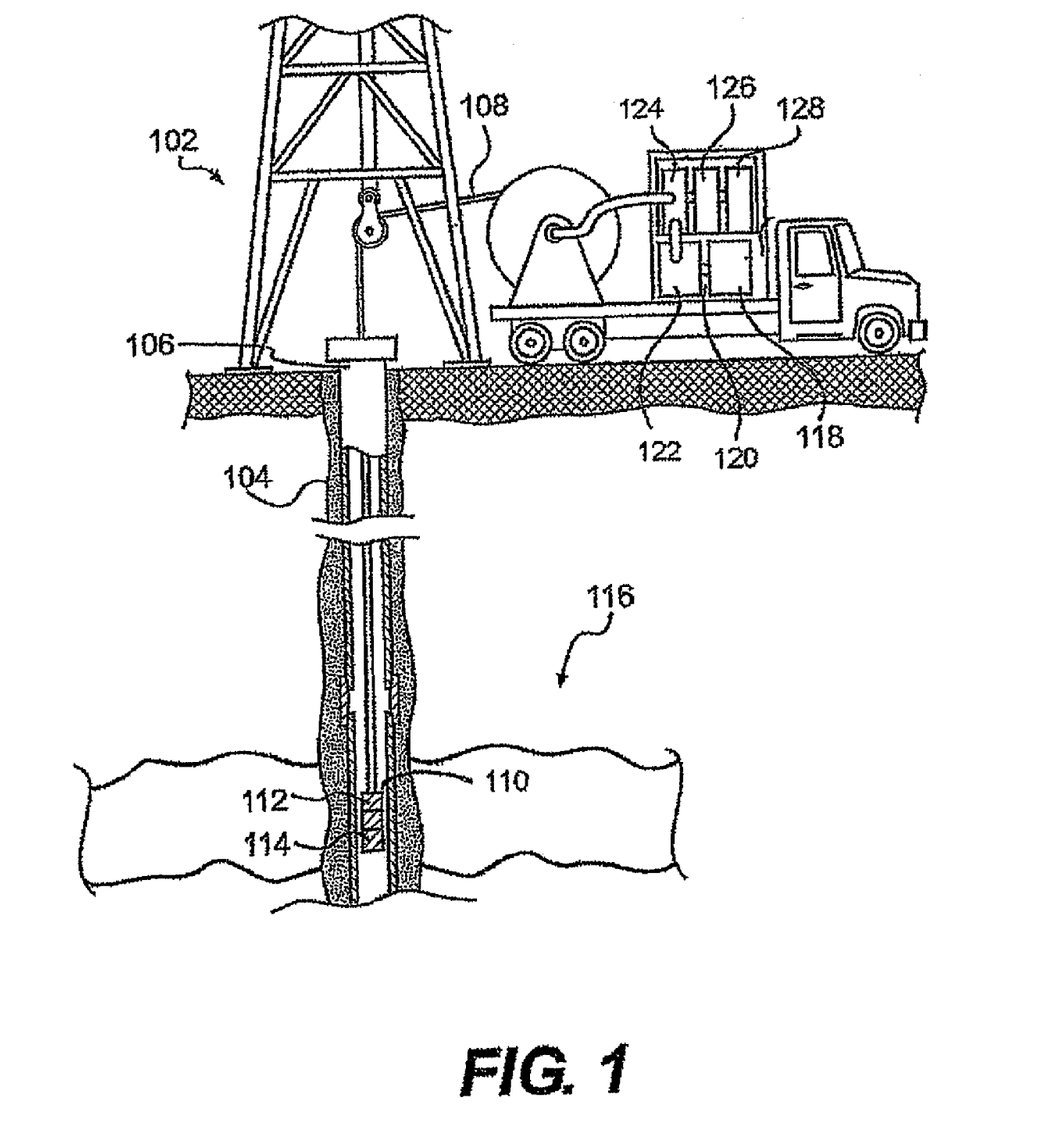
FIG. 1 is a representation of one exemplary system of the invention in the context of its application at an oil well site.

Turning now to the drawings wherein like numerals indicate like parts, FIG. 1 is a representation of an oil well drilling system which identifies one operative context of the disclosure herein. A conventional drilling derrick 102 is shown positioned above an oil well borehole 104. A casing 106 has been installed within the borehole and cemented in place. The borehole may extend thousands of feet into the earth's crust, perhaps 25,000 feet or so, into an oil and/or gas bearing formation. Ambient conditions at this depth may be 20,000 pounds pressure per square inch and 150-175° C. in temperature.

Logging instrumentation, including fluid meters, used in situ can be positioned in a well by attaching them to, for example, a wire line cable 108. A logging tool 110 typically has an instrumentation or sonde section 112 and one or more sensing sections 114. The logging tool is lowered into the wellhole on the wireline 108 using techniques well known to those in the art. The sensing section or sections 114 are positioned within a formation zone 116 where logging is to occur. An optical fiber (not shown) is run along with the wireline to a flow meter in accordance with the present disclosure which maybe incorporated into the sensor section 114. Alternatively the subject flow meter may be a stand alone unit and used for its intended fluid metering function.

A source of coherent light 118 is directed through an optical fiber cable 120 containing a first optical fiber (not shown). An optical depolarizer 122 is connected in line with said first optical fiber. An optical coupler 124 couples the first optical fiber with a second optical fiber (not shown) which is connected to a signal detection 126 and analyzer stage 128.

Optic Fiber Fluid Flow Meter.

Figure 2:
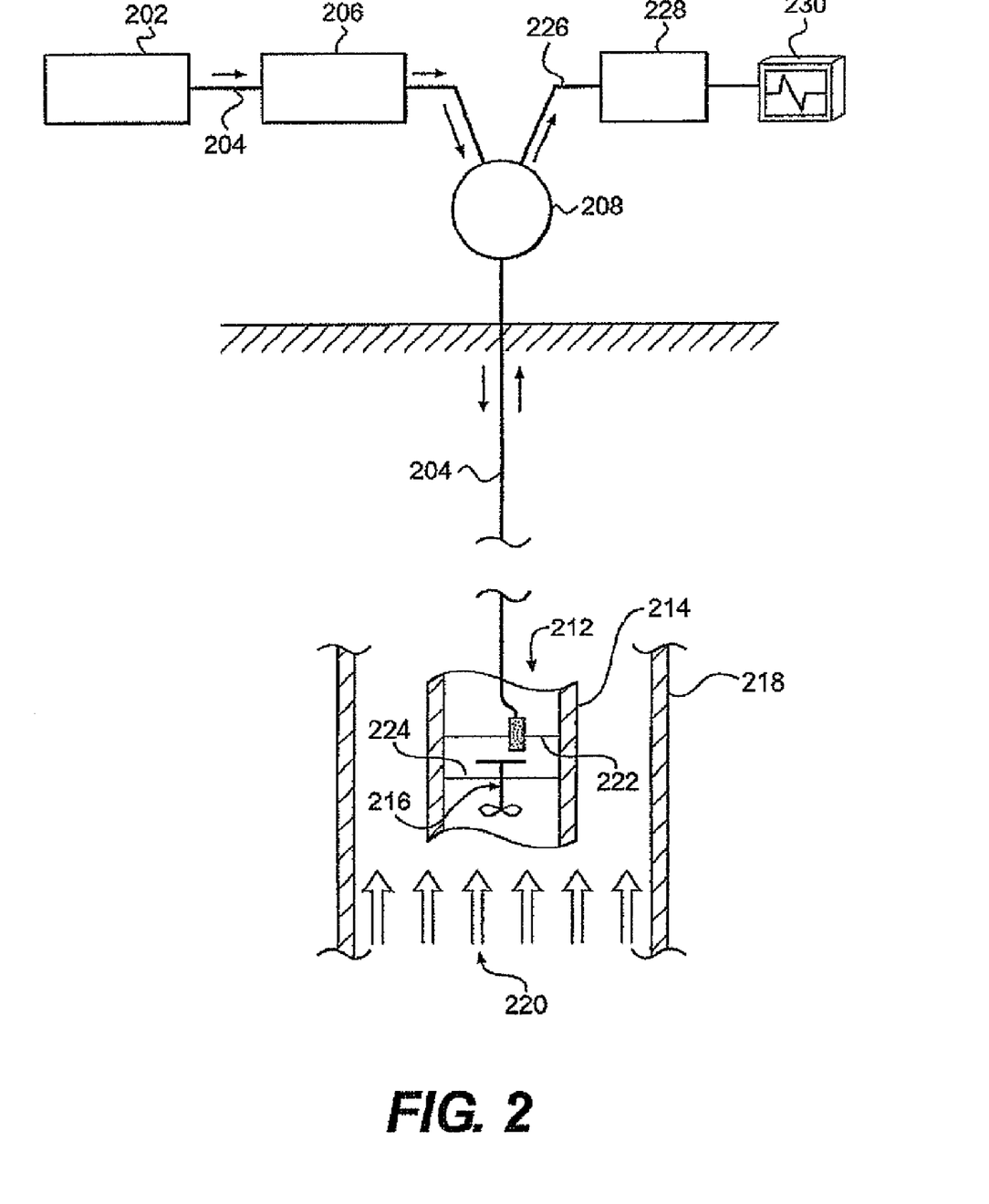
FIG. 2 is a schematic diagram of the components of one embodiment of the disclosure herein.

One preferred embodiment disclosed herein is schematically illustrated in FIG. 2. A coherent source of light 202 is output into a first optical fiber 204. A depolarizer 206 is connected in line with the first optical fiber 204, which in turn is coupled with an optical coupler 208. The light is depolarized using any one of a number of commercial depolarizing devices known in the art.

Depolarized light emerging from the depolarizer 206 is guided within the first optical fiber 204 downhole and passed through a magnetooptical sensor 212 mounted within a meter housing 214. The housing contains in addition to the sensor 212, an impeller/decoder assembly 216. The sensor is lowered by, for example, a wireline (not shown) or other means to a depth in the wellhole 218 at which it is desired to measure fluid flow. In addition to a wireline system, it is contemplated that other methods of deployment such as a slickline, coiled tubing, a measurements while drilling system, a permanent monitoring system, a production logging system, among others, may be utilized for the purposes described herein. The housing 214 is constructed such that fluids flowing (in the instance illustrated in the direction indicated by arrows 220) within the well conduit cause the impeller/decoder assembly 216 to rotate. The sensor 212 and impeller/decoder assembly 216 are mounted within the meter housing 214 by means of thin mechanical struts 222 and 224 respectively designed to offer minimal resistance to the flow of fluids passing through the meter housing 214.

Light returning from the sensor 212 is guided upward through the optical fiber 204. At the optical coupler 208, a second optical fiber 226 branches the light returning from the sensor and directs it to an optical detector 228 where it is transformed into an electrical signal through means of a signal analyzer 230 and subjected to analysis from which flow rate and direction are determined.

Magneto-Optical Sensor.

Figure 3:
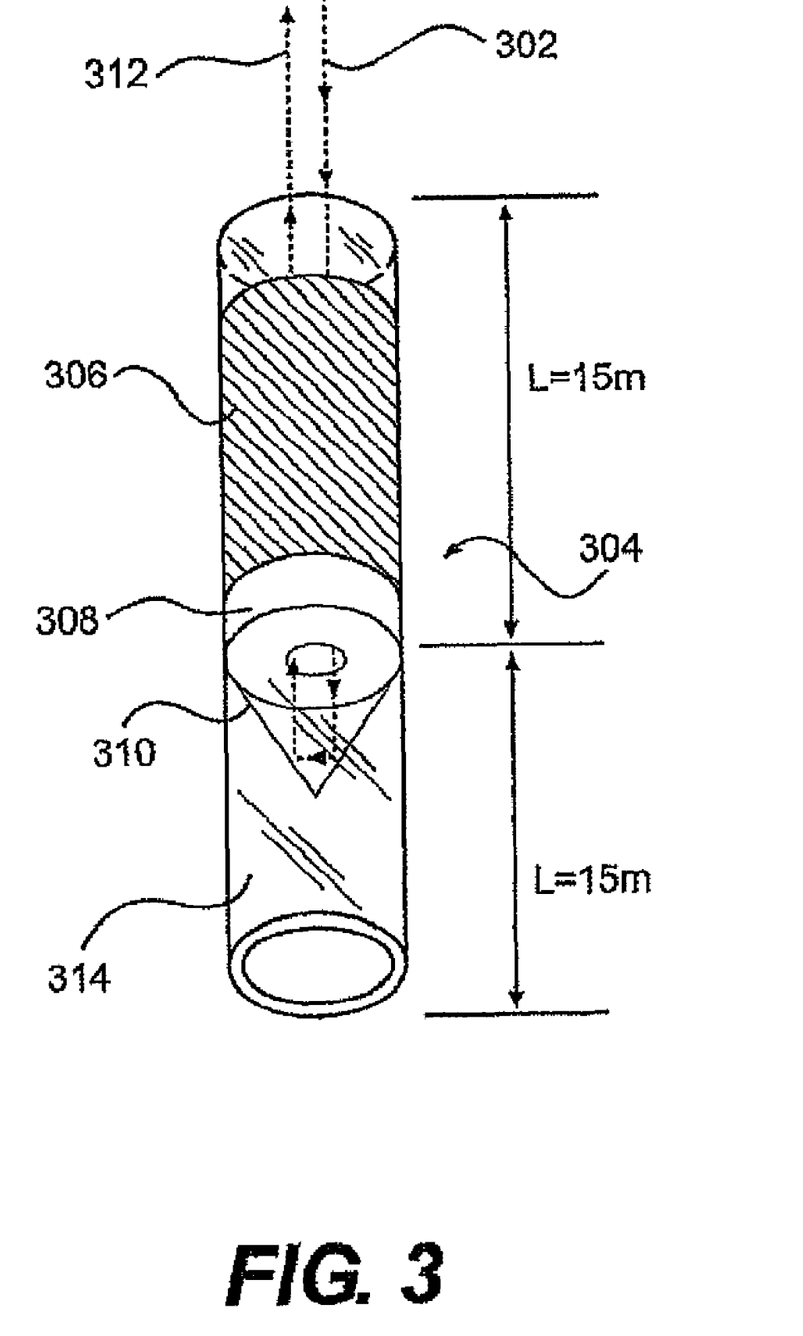
FIG. 3 represents the schematic details of a sensor herein using a reflected light source.

The disclosure herein includes a magneto-optical sensor which operates as a result of the Faraday diffraction effect and which in the presence of a magnetic field affects the intensity of light traversing a Faraday crystal. The sensor comprises at least one optical collimator and a Faraday crystal. One embodiment of such a sensor is shown in FIG. 3.

Depolarized light 302 is guided into the sensor 304 through a first optical fiber (not shown). The fiber is connected to a collimator 306, which is connected in series to a Faraday crystal 308. The collimator assures that parallel rays of light enter the Faraday crystal. A corner cube 310 is positioned adjacent to and optically downstream of the Faraday crystal 308 and reflects incident light 180 degrees back through the first optical fiber, as a beam 312 where it is guided back to the surface and through the path described in connection with FIG. 2.

Other devices to accomplish the same light guides, such as using reflecting devices other than a corner cube 310, will readily present themselves to one of skill in the art. One Faraday crystal employed in the disclosure herein is an iron garnet. Other magnetooptical crystals are also known in the art.

The sensor may be housed within a cylindrical capillary 314 to maintain alignment of its components and to protect it from the often harsh ambient temperature and pressure conditions within a bore hole. In one preferred embodiment, the capillary 314 comprises a cylindrical glass sleeve which has an outside diameter of 2.7 mm and a length of about 30 mm total, with the Faraday crystal centered within the length of the capillary.

As indicated in FIG. 2, the sensor 212 may be positioned immediately above an impeller/decoder assembly 216, with as small a separation as is possible to avoid a distortion of the magnet field caused by the permeability of the larger masses of ferromagnetic material present in a well casing. In one embodiment a separation of approximately 0.25 centimeters is provided.

Impeller/Decoder Assembly

Figure 4:
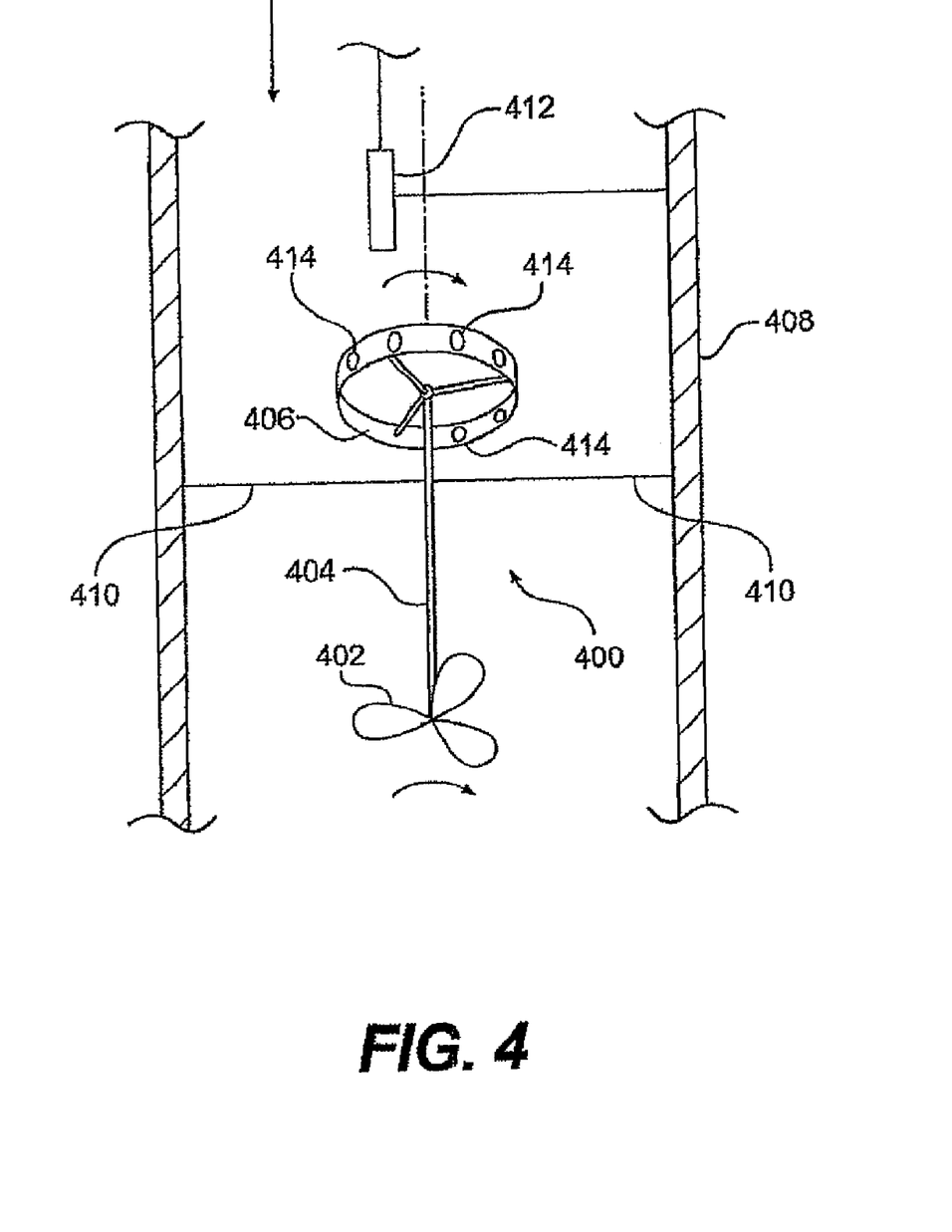
FIG. 4 represents schematic details of an impeller and coupled decoder.

FIG. 4 is a schematic representation of the impeller/decoder assembly 400 in accordance with one preferred embodiment of the invention. Such assembly comprises an impeller 402 coupled mechanically by a shaft 404 to a decoder 406. The impeller/decoder assembly 400 is positioned within a sensor housing 408 by mechanical struts 410 which, in order to minimize resistance to the flow of fluids passing through the housing 408, are recommended to be as thin as feasible. The shaft 404 is mounted within a sleeve (bearing) by customary means to allow rotation of the shaft with minimal friction.

The decoder 406 operates by creating a magnet field which is detected by a sensor 412. The field is created by permanent magnets 414 disposed on the periphery of the decoder 406. As the decoder rotates, by virtue of fluid flowing past the impeller 402, light passing through the Faraday crystal within the sensor 412 undergoes changes in its intensity as a result of a Faraday diffraction effect. As discussed below in connection with FIGS. 7 and 8, characteristic digital signals are created which are guided back to the surface of the well through optical fiber 204.

Characteristics of Faraday Diffraction Effect.

Figure 5:
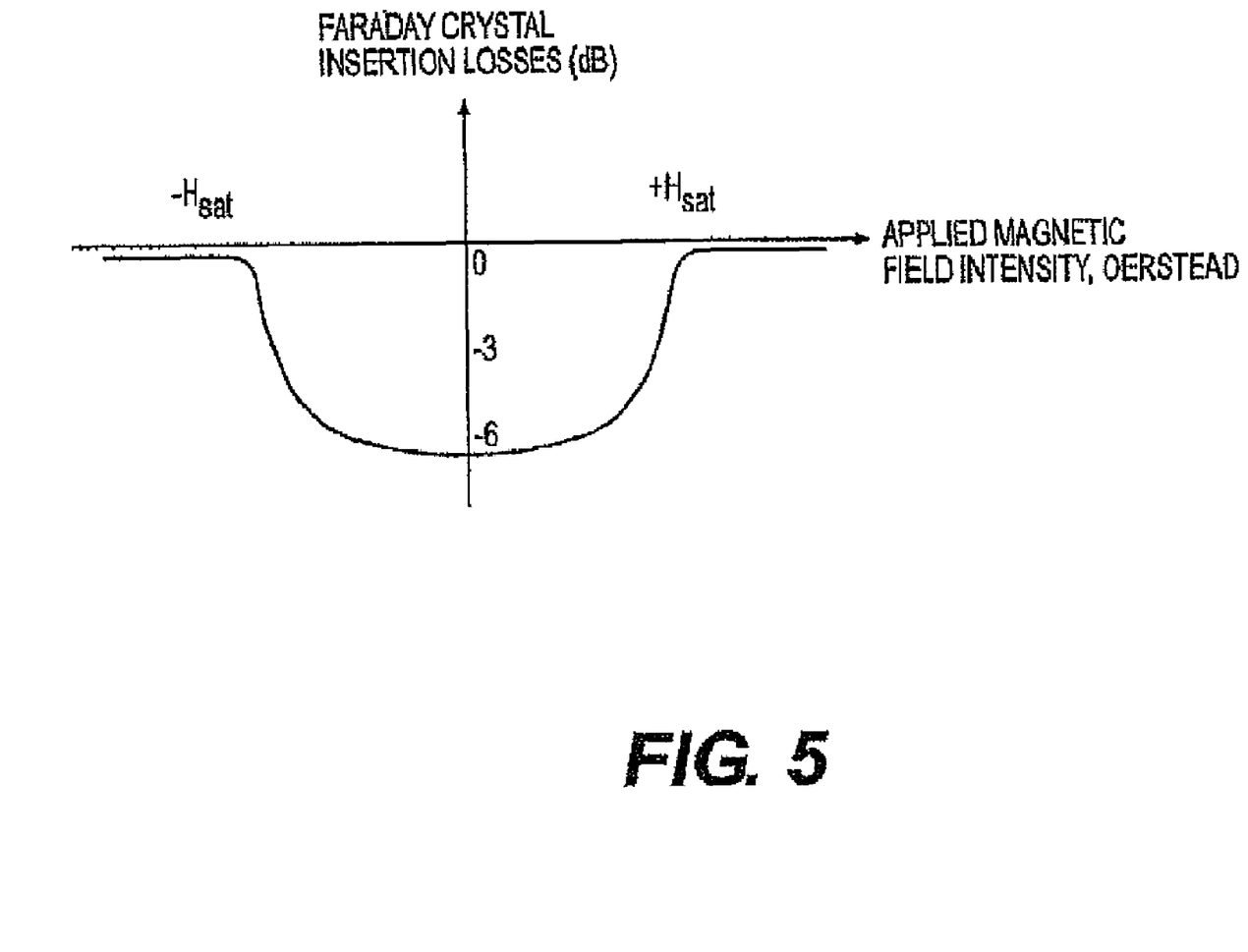
FIG. 5 depicts a typical plot of Faraday crystal losses (in dB) as a function of an applied magnetic field intensity (in Oersteads) wherein a bias point may be located within the regions of linearity on the curve, thus permitting more convenient determinations of magnetic field anomalies.

FIG. 5 is a plot of the attenuation of the light, i.e., insertion loss, (in dB) traversing a Faraday crystal as a function of the applied magnetic field (in Oersteads). The insertion loss of light traversing a Faraday crystal is a function of the magnetic field strength surrounding the crystal. This alternation can be used to create a flow meter in accordance with the invention.

The disclosure herein is based on the concept that changes in magnetic flux affect the diffraction of light passing through a Faraday crystal of magnetooptical properties, as discussed by G. B. Scott and D. E. Lacklison, "Magnetooptic Properties and Applications of Bismuth Substituted Iron Garnets," *IEEE Transactions on Magnetics*, Vol. Mag. 12, No. 4, July 1976, and T. R. Johansen et al, "Variation of Stripe Domain Spacing in a Faraday Effect Light Deflector," *Journal of Applied Physics*, Vol. 42, No. 4, Mar. 15, 1971. The disclosures of these publications are incorporated herein by reference.

Figure 6A:
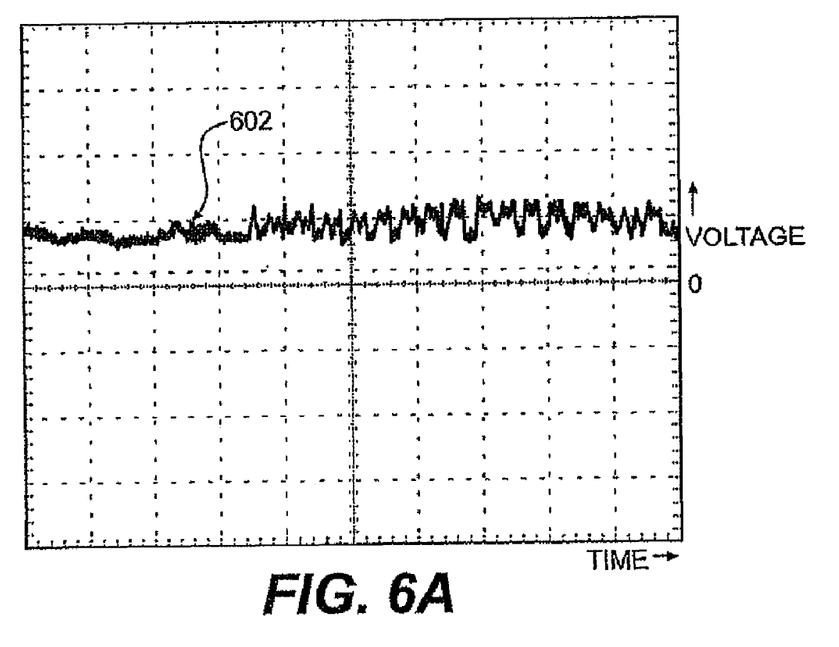
FIGS. 6A and 6B are representative signal outputs from a sensor through which unpolarized light (FIG. 6A) and polarized light (FIG. 6B) are directed.
Figure 6B:
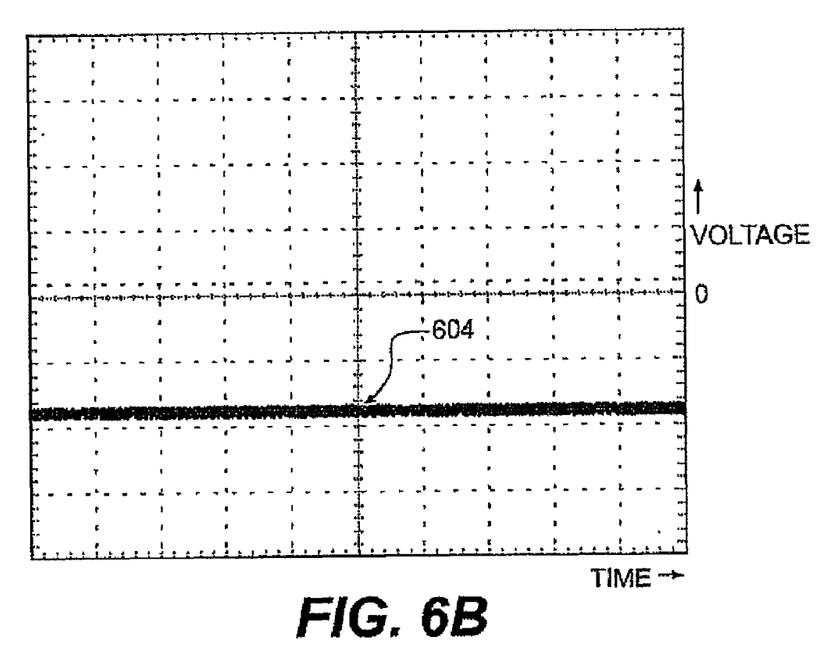

The use of non-polarized light may be preferred in the operation of the sensor utilized in the flow meter. FIG. 6A shows an oscilloscope trace of a baseline 602 of a returned signal in which polarized light was employed. FIG. 6B, by contrast, shows a baseline 604 of the returned signal in which depolarized light was used. Depolarized light provides a cleaner, more stable baseline from which sharper digital signals may be generated.

Meter Operation.

A rotating decoder 400 with differing strength magnets 414 disposed around the periphery of such decoder will create signals with a strength which will be related to the strength of the magnets 414. Both the rotation direction of the decoder, and hence the direction of the flow of fluids metered, can be detected by combining different strength magnets at differing locations around the periphery of a decoder.

Figure 7A:
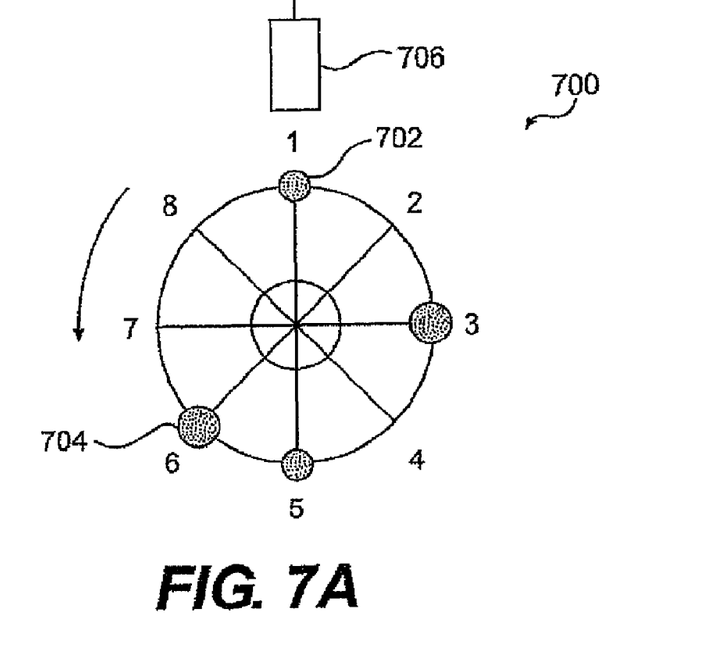
FIGS. 7A and 7B are schematic illustrations of one decoder in a counterclockwise rotation of the impeller (FIG. 7A) and a representative signal output (FIG. 7B) from the sensor resulting from such rotation.
Figure 7B:
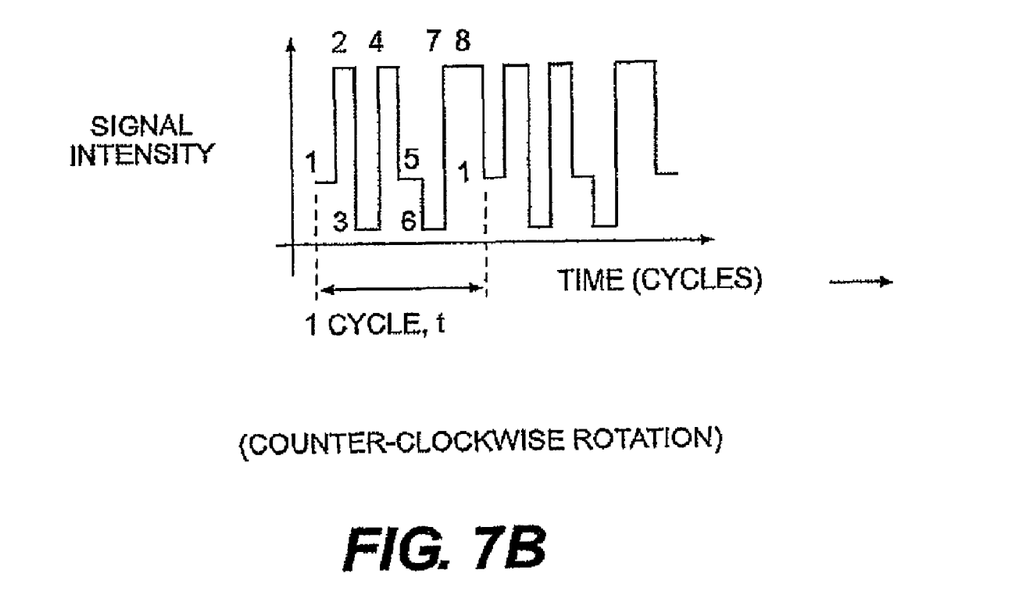
Figure 8A:
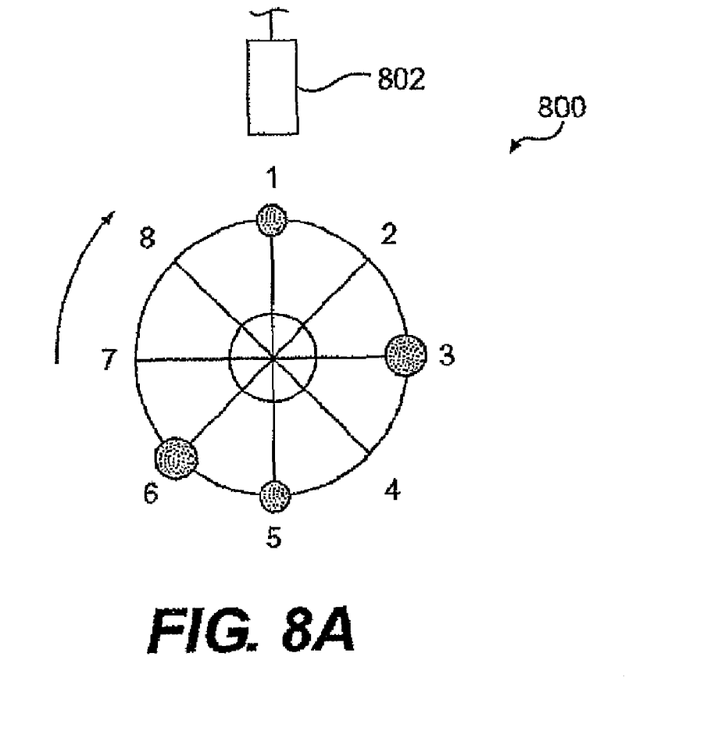
FIGS. 8A and 8B are schematic illustrations of the decoder in a clockwise rotation of the impeller (FIG. 8A) and a representative signal output (FIG. 8B) from the sensor resulting from such rotation.

In FIGS. 7A and 8A, a single decoder 700 and 800 respectively is shown. Two strengths of magnets are shown, reflected in the figures by the size of circles 702 and 704 representing such magnets. Positions on the periphery of the decoder are denoted by numbers from 1 to 8. In FIG. 7A it is assumed that the decoder is rotating counterclockwise. FIG. 7B reflects the signal output of a sensor 706 with magnets in accordance with the pattern of magnets shown in FIG. 7A.

Figure 8B:
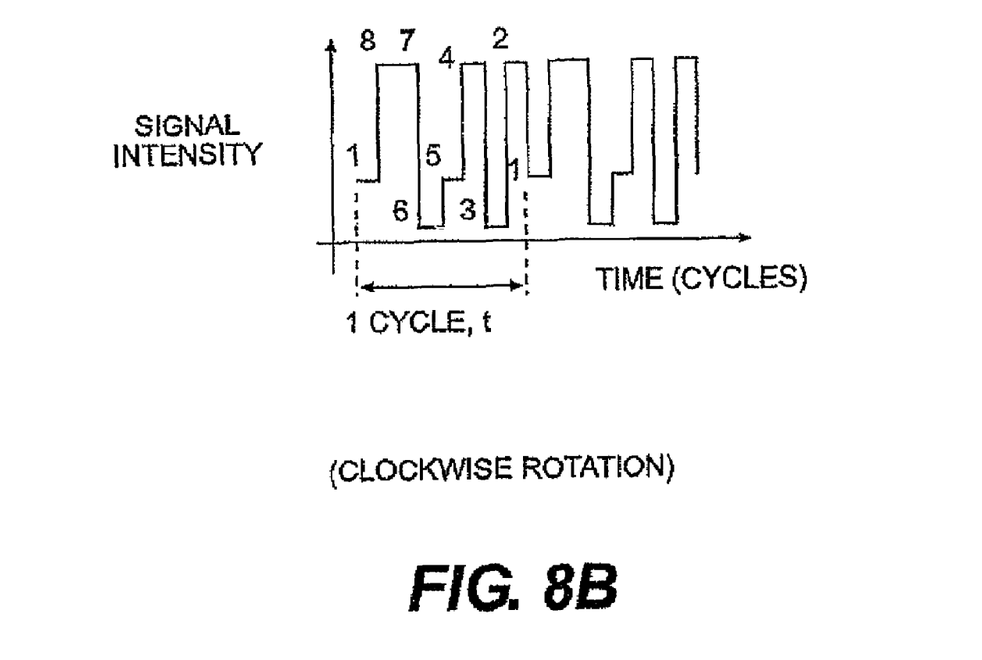

In FIG. 8A, it is assumed that the decoder is rotating clockwise. FIG. 8B reflects a signal output from a decoder 800 rotated in a clockwise direction. The signal output from the sensor 802 in FIG. 8B is reversed in pattern from the output of FIG. 7B. The difference in signal output pattern distinguishes the direction of rotation. The rotating decoder in each case generates a cyclical digital signal as the decoder revolves through 360 degrees. The rate of rotation is therefore determinable from the cycle rate reflected in the signals. Methods for analyzing such signals are well known in the art.

Figure 9:
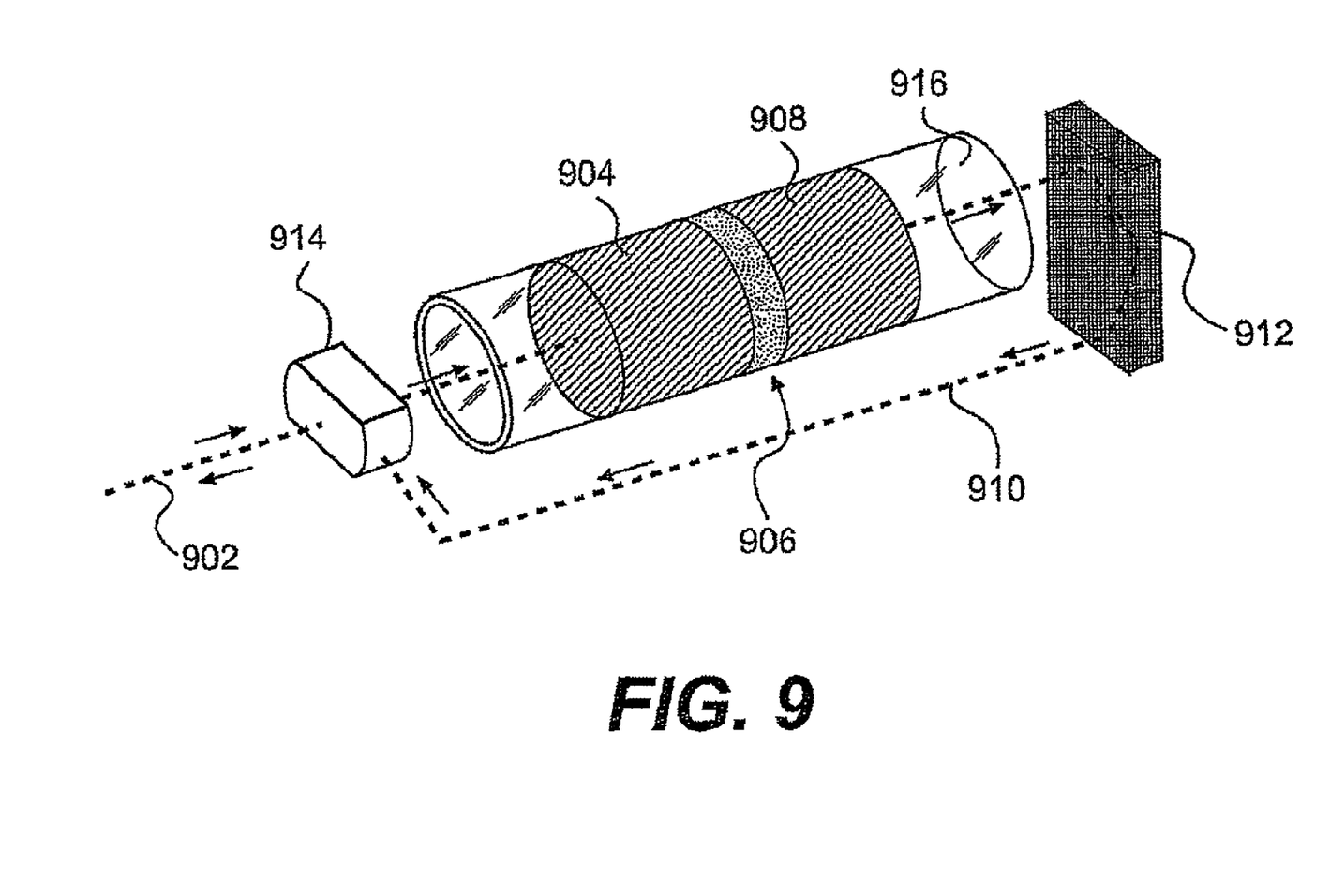
FIG. 9 depicts another embodiment of a sensor in which a light beam from a light source is not reflected backwards after passing through the Faraday crystal but is instead guided through an optical fiber loop coupled to the descending optical fiber from the surface.

In the sensor 304 described above, light traverses the Faraday crystal 308 twice, due to its reflection by the corner cube 310 shown in FIG. 3. This double passage of the light results in an insertion loss. The loss may be lessened, and sensitivity of the results improved, by the use of a single pass of the light through the Faraday crystal. Such a sensor is depicted in FIG. 9.

In this embodiment, a fiber optic light beam 902 is passed through a collimator 904, a Faraday crystal 906, and a second collimator 908. Instead of being reflected backward through the Faraday crystal 906, an optical fiber loop 910 is created by means of a mini-bend fiber 912 capable of a bending radius of less than 15 mm. The loop is re-coupled to the first optical fiber 902 through an optical coupler 914. The sensor is housed in a capillary 916, which may be composed of glass or other material capable of withstanding ambient temperature and pressure conditions within the well hole.

The foregoing embodiments have each employed a single optical fiber through which light is transmitted downhole to a sensor and simultaneously returned to a photo-detector located at the surface. Other embodiments may be employed in which separate optical fibers are used for insertion of light to a sensor and as a return guide of the light after its passage through a Faraday crystal. Such an embodiment would not require optical couplers which also entail insertion losses and, thus, the embodiment may present more sensitive data results.

Various aspects of the invention were chosen and described in order to best explain principles of the invention and its practical applications. The preceding description is intended to enable those of skill in the art to best utilize the invention in various embodiments and aspects and with modifications as are suited to the particular use contemplated. It is intended that the scope of the invention be defined by the following claims.

What is claimed is:

1. A system for measuring at least one of the rate and direction of the flow of fluids in a conduit within a wellhole, said system comprising:
    a source of light located outside a well;
    a first optical fiber operable to extend into a wellhole connected to said source of light;
    an optical coupler in line with said first optical fiber;
    a second optical fiber connected to the said optical coupler;
    a signal detector and analyzer connected to said second optical fiber; and
    a sensor assembly connected downhole to said first optical fiber, including:
        an optical collimator attached to said first optical fiber,
        a Faraday crystal positioned optically downstream of said optical collimator,
        an optical reflecting device positioned optically downstream of said Faraday crystal operable for redirecting the light back through said first optical fiber and, ultimately, to the said signal detector and analyzer located at the well surface, wherein said sensor assembly is operable to detect light insertion losses as a function of perturbations in magnetic fields near said sensor;
        a decoder comprising at least one permanent magnet; and
        an impeller connected to said decoder and being operable to rotate as a result of fluids flowing within said wellhole conduit wherein the angular rotation of the impeller and decoder are equal in both direction of rotation and angular velocity.

2. A system for measuring at least one of the rate and direction of the flow of fluid in a conduit within a wellhole, as defined in claim 1, and further comprising:
    an optical depolarizer in line with said first optical fiber and located between the wellhole and the source of light, and the optical coupler being located between the optical depolarizer and the wellhole.

3. A system for measuring at least one of the rate and direction of the flow of fluid in a conduit within a wellhole, as defined in claim 1, wherein said at least one permanent magnet comprises;
    at least two permanent magnets of different magnetic strength.

4. A system for measuring at least one of the rate and direction of the flow of fluid in a conduit within a wellhole, as defined in claim 3, wherein said at least one permanent magnet comprise;
    at least four permanent magnets.

5. A system for measuring at least one of the rate and direction of the flow of fluid in a conduit within a wellhole, as defined in claim 4, wherein said at least four permanent magnets comprise:
    at least four permanent magnets of at least two magnetic strengths disposed around the detector in alternating order of magnetic strength and with non-uniform spacing.

6. A system for measuring at least one of the rate and direction of the flow of fluid in a conduit within a wellhole, as defined in claim 1, wherein said optical reflecting device comprises:
    a corner cube.

7. A system for measuring at least one of the rate and direction of the flow of fluid in conduit within a wellhole, as defined in claim 1, and further comprising:
    a glass capillary surrounding at least said optical collimator and said Faraday crystal.

8. A system for measuring at least one of the rate and direction of the flow of fluid in a conduit within a wellhole, said system comprising:
    a source of light located outside a well;
    a first optical fiber operable to extend into a wellhole connected to said source of light;
    an optical depolarizer in line with the said first optical fiber and located between the wellhole and the source of light;
    a first optical coupler in line with the said first optical fiber located between the optical polarizer and the well hole;
    a second optical fiber connected to the said optical coupler;
    a signal detector and analyzer connected to said second optical fiber;
    a second optical coupler located downhole and connected to said first optical fiber;
    a sensor assembly connected downhole to said second optical coupler, said sensor assembly, including:
        a first optical collimator attached to said first optical fiber,
        a Faraday crystal positioned optically downstream of said first optical collimator,
        a second optical collimator attached optically downstream of said Faraday crystal,
        an optical fiber loop operable for guiding light from said second optical collimator to said second optical coupler and from said second optical coupler to said first optical fiber uphole through said first optical fiber and, ultimately, to the said signal detector and analyzer located at the well surface, wherein said sensor assembly is operable to detect light insertion losses as a function of perturbations in magnetic fields near said sensor,
        a decoder comprising a circular ring and at least one permanent magnet attached to said ring, and an impeller connected to said decoder being operable to rotate as a result of fluids flowing within said wellhole conduit wherein the angular rotation of the impeller and decoder are equal in both direction of rotation and angular velocity.

9. A system for measuring at least one of the rate and direction of the flow of fluid in a conduit within a wellhole, as defined in claim 8, in which the said optical fiber loop comprises:

an optical guide operable to direct polarized light traversing said second optical collimator through a radius not exceeding 15 mm.

10. A system for measuring at least one of the rate and direction of the flow of fluid in conduit within a wellhole, as defined in claim 9, in which the said optical guide comprises:

a mini-bend fiber.

11. A method for measuring at least one of the rate and direction of the flow of fluid in conduit within a wellhole, said method comprising:

providing a source of light located outside a well;

depolarizing light from said source of light;

transmitting said depolarized light through an optical fiber into a wellhole to a sensor positioned within said wellhole, said sensor having a Faraday crystal and a decoder/impeller assembly in sufficiently close proximity to said Faraday crystal to enable sensing of magnetic field perturbations created by rotation of said decoder/impeller assembly by fluid flowing in said conduit;

reflecting light which has traversed the Faraday crystal back through such Faraday crystal and to the optical fiber for transport to the surface of the well; and detecting and analyzing said reflected light for insertion losses to determine rate and/or direction of fluid flowing within the wellhole conduit.

12. A method for measuring at least one of the rate and direction of the flow of fluid in conduit within a wellhole, said method comprising:

providing a source of light located outside a well;

depolarizing light from said source of light;

transmitting said depolarized light through an optical fiber into a wellhole to a sensor positioned in said wellhole conduit, said sensor comprising a Faraday crystal and a decoder/impeller assembly;

collimating said depolarized light passing through said sensor;

wherein the decoder/impeller assembly is located in sufficient close proximity to said Faraday crystal to enable sensing of magnetic field perturbations created by rotation of said decoder/impeller assembly by fluid flowing in said conduit;

guiding the light traversing the Faraday crystal through a second collimator and through an optical fiber loop such that light traverses the Faraday crystal only once before it is directed to the surface of the well; and detecting and analyzing said reflected light for insertion losses to determine rate and/or direction of fluid flowing within the wellhole conduit.

\* \* \* \* \*